(12) United States Patent
Kono et al.

(10) Patent No.: US 8,932,926 B2
(45) Date of Patent: Jan. 13, 2015

(54) METHOD FOR FORMING GATE OXIDE FILM OF SIC SEMICONDUCTOR DEVICE USING TWO STEP OXIDATION PROCESS

(75) Inventors: Hiroshi Kono, Kawasaki (JP); Takuma Suzuki, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 453 days.

(21) Appl. No.: 12/554,369

(22) Filed: Sep. 4, 2009

(65) Prior Publication Data
US 2010/0081243 A1    Apr. 1, 2010

(30) Foreign Application Priority Data
Sep. 26, 2008    (JP) .................................. 2008-249164

(51) Int. Cl.
*H01L 21/336* (2006.01)
*H01L 21/04* (2006.01)
*H01L 29/16* (2006.01)
*H01L 29/66* (2006.01)

(52) U.S. Cl.
CPC ........ *H01L 21/0465* (2013.01); *H01L 29/1608* (2013.01); *H01L 29/66068* (2013.01)
USPC ..................................... 438/268; 257/E21.41

(58) Field of Classification Search
CPC ..................... H01L 29/1608; H01L 29/66068; H01L 21/049; H01L 21/02238; H01L 21/31662; H01L 21/02255; H01L 21/28202; H01L 27/12; H01L 29/045; H01L 29/0847; H01L 21/02236; H01L 21/28211; H01L 21/3226; H01L 21/31116
USPC ..................................... 438/268; 257/E21.41
See application file for complete search history.

(56) References Cited

U.S. PATENT DOCUMENTS

| 4,518,630 A | * | 5/1985 | Grasser .......................... 438/774 |
| 5,972,801 A | * | 10/1999 | Lipkin et al. .................. 438/770 |
| 6,177,312 B1 | * | 1/2001 | He et al. ........................ 438/257 |
| 6,797,323 B1 | * | 9/2004 | Kashiwagi et al. ....... 427/255.29 |
| 2003/0013266 A1 | * | 1/2003 | Fukuda et al. ................ 438/400 |

(Continued)

FOREIGN PATENT DOCUMENTS

| JP | 11-186255 A | 7/1999 |
| JP | H 11-186255 | 7/1999 |

(Continued)

OTHER PUBLICATIONS

Endo, et al., "High Channel Mobility of MOSFET Fabricated on F4-SiC (11-20) Face Using Wet Annealing", Materials Science Forum vols. 600-603, 2009, pp. 691-694.
First Office Action (with English translation) dated Mar. 19, 2013 from corresponding Japanese Application No. 2008-249164, 4 pages.

(Continued)

*Primary Examiner* — Kimberly Rizkallah
*Assistant Examiner* — Duy T Nguyen
(74) *Attorney, Agent, or Firm* — Ohlandt, Greeley, Ruggiero & Perle, L.L.P.

(57) ABSTRACT

A method for manufacturing a semiconductor device, includes forming a gate oxide film on an SiC region by a first thermal oxidation treatment in a first oxidizing atmosphere, performing a second thermal oxidation treatment at an oxidation speed of at most 5 nm/hour in a second oxidizing atmosphere having a lower oxygen concentration than the first oxidizing atmosphere, to increase film thickness of the gate oxide film, after the first thermal oxidation treatment, and forming a gate electrode on the gate oxide film with the increased film thickness.

15 Claims, 6 Drawing Sheets

(56) References Cited

U.S. PATENT DOCUMENTS

| | | |
|---|---|---|
| 2005/0218463 A1* | 10/2005 | Hao et al. ............ 257/411 |
| 2006/0177991 A1* | 8/2006 | Murakami et al. ............ 438/455 |
| 2007/0045631 A1* | 3/2007 | Endo et al. ............ 257/77 |
| 2007/0231932 A1* | 10/2007 | Reynaud et al. ............ 438/14 |
| 2007/0267142 A1* | 11/2007 | Murphy et al. ............ 156/345.24 |
| 2008/0128851 A1* | 6/2008 | Aga et al. ............ 257/506 |
| 2008/0233285 A1* | 9/2008 | Das et al. ............ 427/248.1 |
| 2009/0227100 A1* | 9/2009 | Yamanobe et al. ............ 438/586 |

FOREIGN PATENT DOCUMENTS

| | | |
|---|---|---|
| JP | 2001-210637 A | 8/2001 |
| JP | 2007-96263 | 4/2007 |

OTHER PUBLICATIONS

Office Action (with English translation) dated Jan. 7, 2014 from corresponding Japanese Application No. 2008-249164, 4 pages.

* cited by examiner

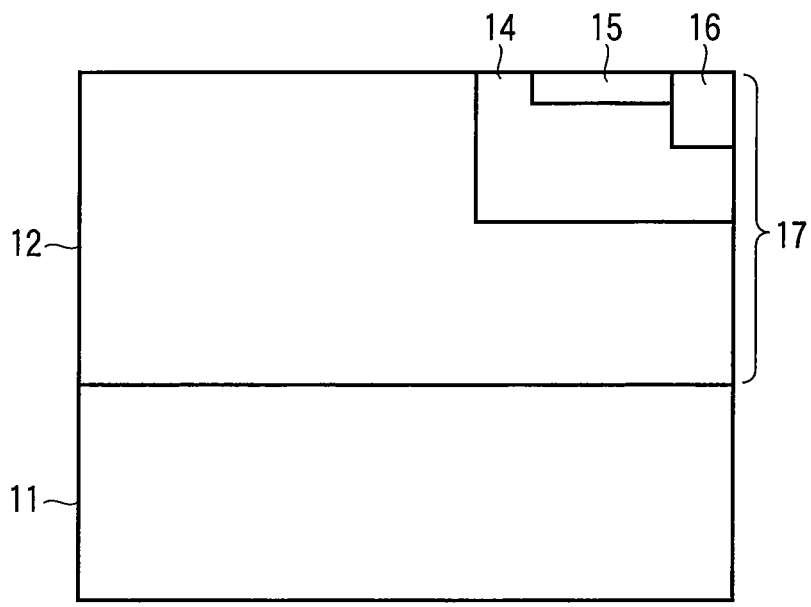
F I G. 3
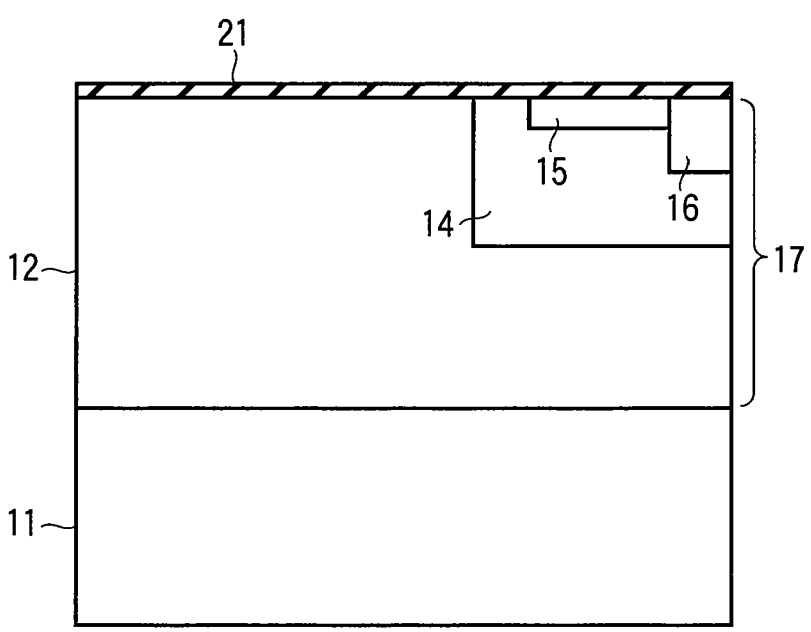
F I G. 4

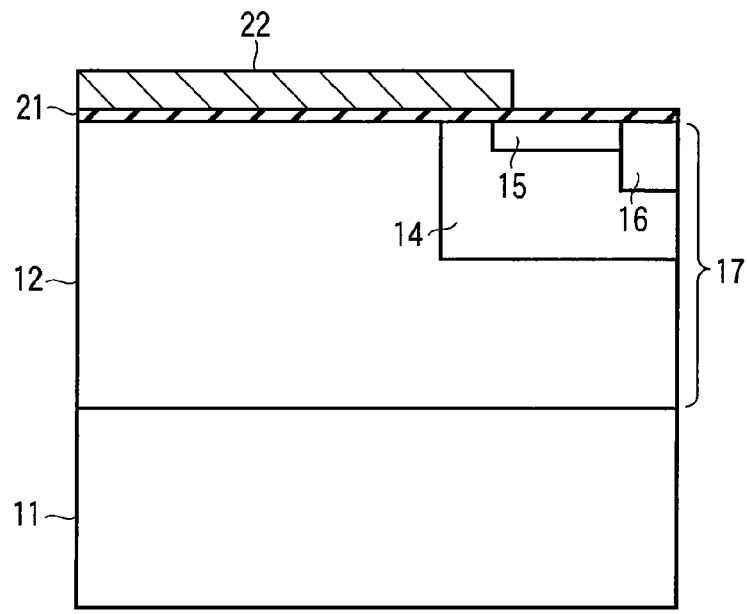
F I G. 5
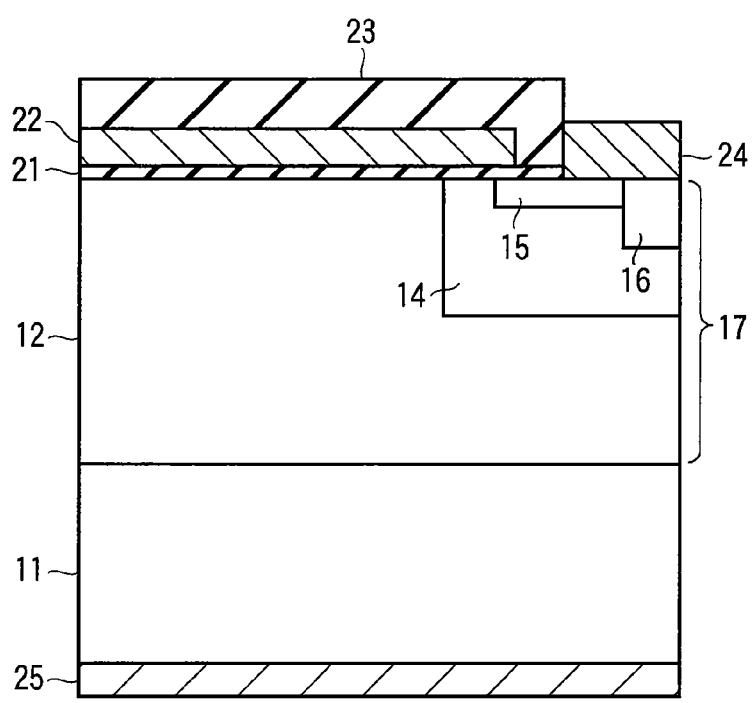
F I G. 6

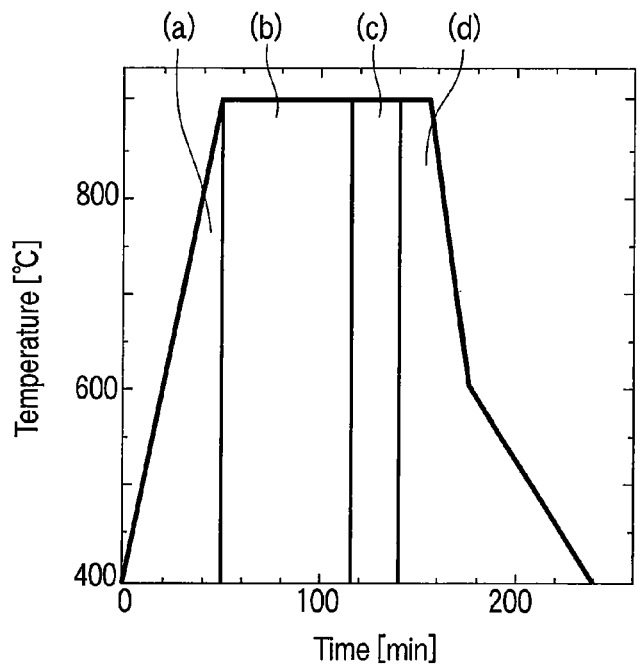
F I G. 7
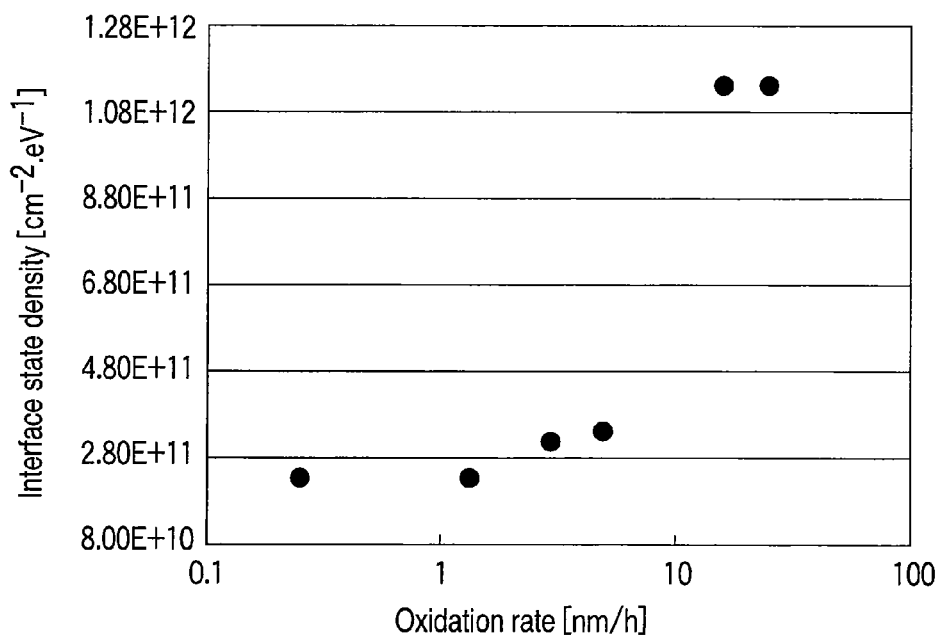
F I G. 8

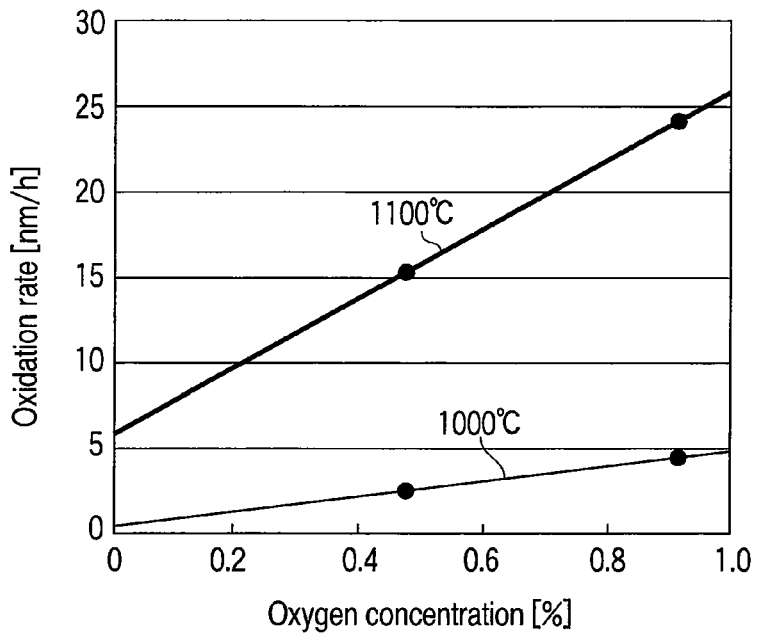
F I G. 9
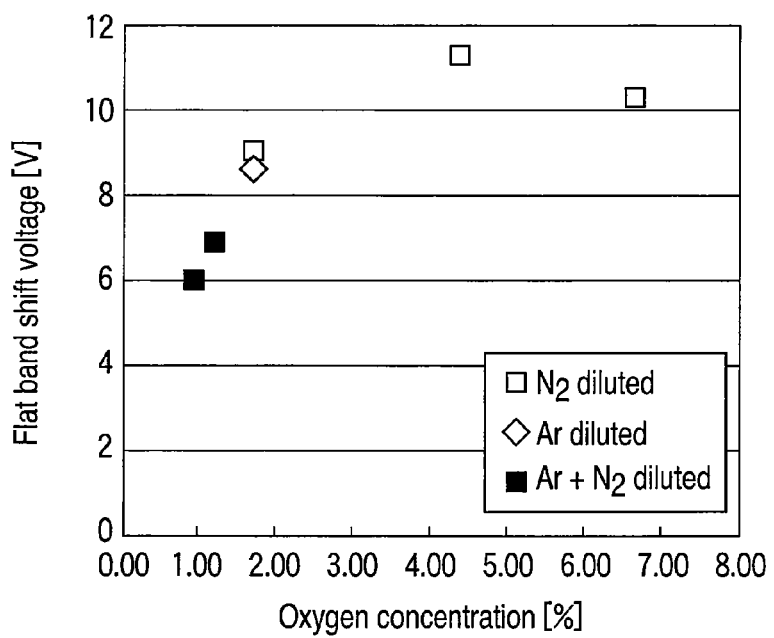
F I G. 10

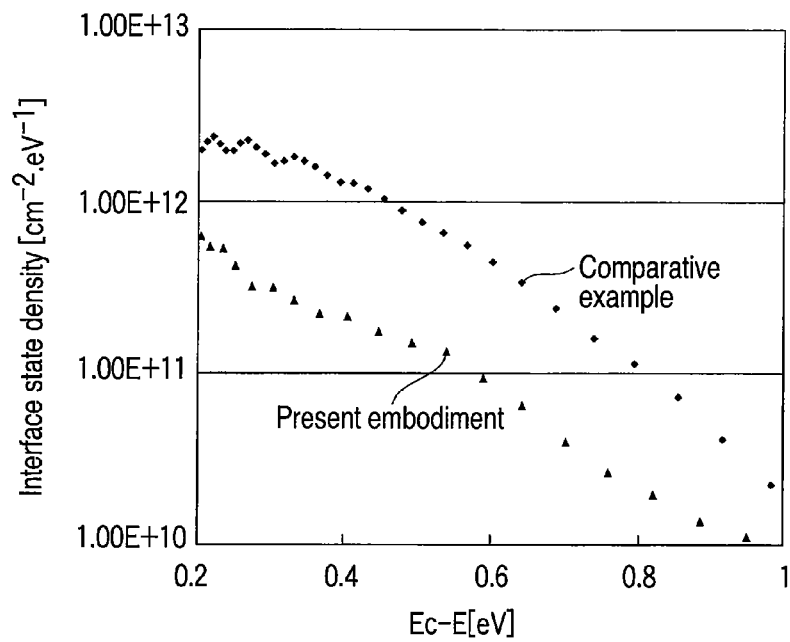
F I G. 11
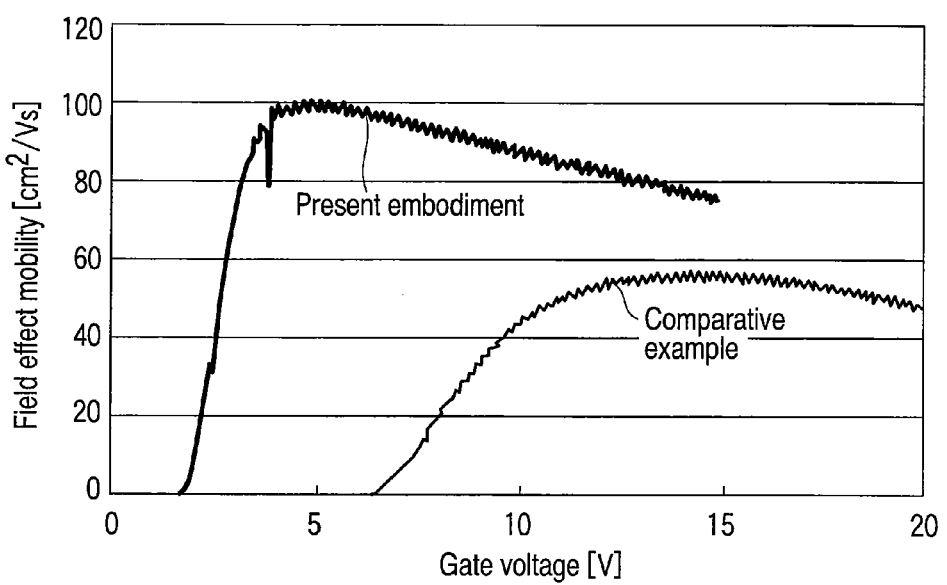
F I G. 12

US 8,932,926 B2

METHOD FOR FORMING GATE OXIDE FILM OF SIC SEMICONDUCTOR DEVICE USING TWO STEP OXIDATION PROCESS

CROSS-REFERENCE TO RELATED APPLICATIONS

This application is based upon and claims the benefit of priority from prior Japanese Patent Application No. 2008-249164, filed Sep. 26, 2008, the entire contents of which are incorporated herein by reference.

BACKGROUND OF THE INVENTION

1. Field of the Invention

The present invention relates to a method for manufacturing a semiconductor device.

2. Description of the Related Art

Silicon carbide (SiC) has a band gap that is about three times as large as that of Si, and a breakdown field strength that is about ten times as high as that of Si. The silicon carbide thus enables a sharp reduction in on resistance.

However, if a gate oxide film in a MOS transistor made of SiC is formed by a normal thermal oxidation method, the transistor disadvantageously offers a high interface state density. Thus, the channel mobility of the MOS transistor exhibits a very small value of several $cm^2/Vs$.

To solve this problem, a method has been proposed which forms a gate oxide film by wet oxidation and then reduces temperature with a wet oxidation atmosphere maintained intact (see JP-A 2007-96263 (KOKAI)). This method enables formation of a MOS transistor exhibiting a channel mobility of about 50 $cm^2/Vs$ and a flat band shift of about 5 V.

However, even the MOS transistor formed by the above-described method fails to offer sufficient characteristics including a high channel mobility and a low flat band shift. Thus, the conventional art has difficulty providing an SiC-MOS transistor with excellent characteristics.

BRIEF SUMMARY OF THE INVENTION

An aspect of the present invention, there is provide a method for manufacturing a semiconductor device, the method comprising: forming a gate oxide film on an SiC region by a first thermal oxidation treatment in a first oxidizing atmosphere; performing a second thermal oxidation treatment at an oxidation speed of at most 5 nm/hour in a second oxidizing atmosphere having a lower oxygen concentration than the first oxidizing atmosphere, to increase film thickness of the gate oxide film, after the first thermal oxidation treatment; and forming a gate electrode on the gate oxide film with the increased film thickness.

BRIEF DESCRIPTION OF THE SEVERAL VIEWS OF THE DRAWING

FIG. 3 is a sectional view schematically showing a part of the method for manufacturing the semiconductor device according to the embodiment;

FIG. 4 is a sectional view schematically showing a part of the method for manufacturing the semiconductor device according to the embodiment;

FIG. 5 is a sectional view schematically showing a part of the method for manufacturing the semiconductor device according to the embodiment;

FIG. 6 is a sectional view schematically showing a part of the method for manufacturing the semiconductor device according to the embodiment;

FIG. 7 is a diagram showing a sequence used to form a gate oxide film according to the embodiment;

FIG. 8 is a diagram showing the relationship between an oxidation rate and an interface state density observed during a thermal oxidation treatment;

FIG. 9 is a diagram showing the relationship between an oxygen concentration and the oxidation rate observed when a thermal oxidation treatment temperature is set to 1,000° C. and 1,100° C.;

FIG. 10 is a diagram showing the relationship between the oxygen concentration and a flat band shift voltage observed during the thermal oxidation treatment;

FIG. 11 is a diagram showing interface state densities obtained by the method according to the present embodiment and by a method in a comparative example; and FIG. 12 is a diagram showing channel mobilities obtained by the method according to the present embodiment and by the method in the comparative example.

DETAILED DESCRIPTION OF THE INVENTION

An embodiment of the present invention will be described below with reference to the drawings.

FIGS. 1 to 6 are sectional views schematically showing a method for manufacturing a semiconductor device (vertical MOS transistor) according to the embodiment of the present invention.

Figure 1:
FIG. 1 is a sectional view schematically showing a part of a method for manufacturing a semiconductor device according to an embodiment.

First, as shown in FIG. 1, an $n^-$-type SiC (silicon carbide) layer (first region) 12 is formed on an $n^+$-type SiC substrate 11 by epitaxial growth.

Figure 2:
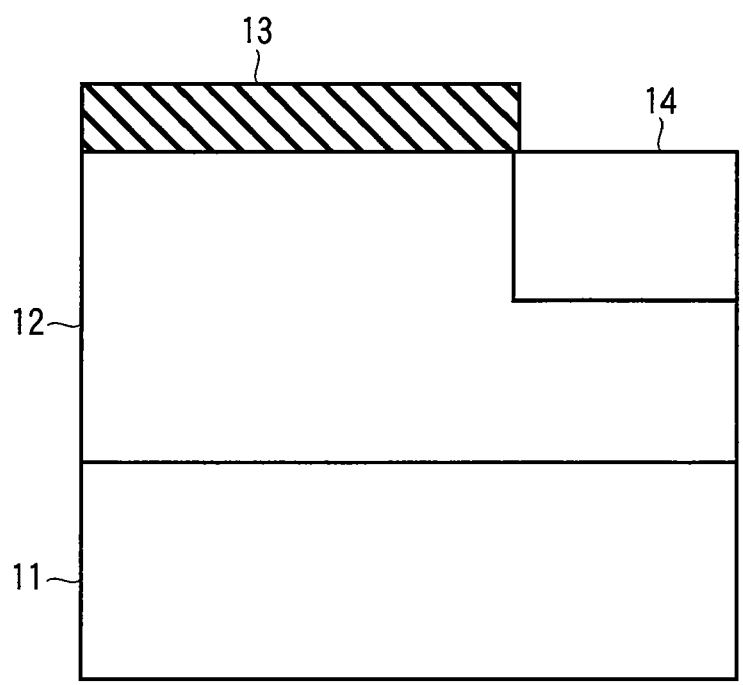
FIG. 2 is a sectional view schematically showing a part of the method for manufacturing the semiconductor device according to the embodiment.

Then, as shown in FIG. 2, a mask film 13 made of an oxide film or the like is formed on the $n^-$-type SiC layer 12. P-type impurities are subsequently ion-implanted using a mask film 13 as a mask to form a $p^-$-type SiC region (second region) 14 in a surface region of the $n^-$-type SiC layer 12.

Then, as shown in FIG. 3, an $n^+$-type SiC region 15 and a $p^+$-type SiC region 16 are formed in a surface region of the $p^-$-type SiC region 14 by ion implantation or the like. The $n^+$-type SiC region 15 serves as a source contact region. The $p^+$-type SiC region 16 serves as a body contact region.

Then, as shown in FIG. 4, a gate oxide film (gate insulating film) 21 is formed on an SiC region 17 including the $n^-$-type SiC layer 12, the $p^-$-type SiC region 14, the $n^+$-SiC region 15, and the $p^+$-SiC region 16. A method for forming the gate oxide film 21 will be described below in detail.

Then, as shown in FIG. 5, a gate electrode 22 made of polysilicon is formed on the gate oxide film 21. The $p^-$-type SiC region 14 has a portion sandwiched between the $n^-$-type SiC layer 12 and the $n^+$-type SiC region 15. The gate electrode 22 is formed at least above the sandwiched portion.

Then, as shown in FIG. 6, an interlayer insulating film 23 covering the gate electrode 22 is formed. Moreover, a source electrode 24 contacting the $n^+$-type SiC region 15 and the $p^+$-type SiC region 16 is formed. Furthermore, a drain electrode 25 contacting the SiC substrate 11 is formed.

As described above, such a semiconductor device (vertical MOS transistor) as shown in FIG. 6 is formed.

A method for forming a gate oxide film 21 as shown in FIG. 4 will be described below in detail.

FIG. 7 is a diagram showing a sequence (steps (a) to (d)) for forming the gate oxide film 21.

First, such a substrate as shown in FIG. 3 is held in a reaction container. The temperature of the reaction container is raised up to a predetermined value of 900° C. (step (a)).

Then, a first thermal oxidation treatment is performed in a first oxidizing atmosphere at 900° C. (step (b)). The thermal oxidation treatment oxidizes the surface of the SiC region 17. A silicon oxide film (gate oxide film) of thickness about 50 nm is formed on the SiC region 17. The thermal oxidation treatment used is a pyrogenic oxidation technique using an oxygen gas ($O_2$ gas) and a hydrogen gas ($H_2$ gas). That is, oxygen and hydrogen are combusted to generate steam ($H_2O$) gas and an oxygen gas ($O_2$ gas). A silicon oxide film is formed on the SiC region by the thermal oxidation treatment in an oxidizing atmosphere made up of the steam and oxygen gas. The oxidizing atmosphere may contain an inert gas as a dilute gas.

Then, the gas is exhausted from the reaction container with temperature maintained at 900° C. A second thermal oxidation treatment is performed in a second oxidizing atmosphere with an oxygen concentration lower than that in the above-described first oxidizing atmosphere (step (c)). The thermal oxidation treatment oxidizes the surface of the SiC region to increase the film thickness of the gate oxide film. The pyrogenic oxidation treatment is also used for the above-described thermal oxidation treatment as is the case with the first thermal oxidation treatment. That is, oxygen and hydrogen are combusted to generate steam ($H_2O$) gas and an oxygen gas ($O_2$ gas). The thermal oxidation treatment is performed in an oxidizing atmosphere made up of the steam and oxygen gas. The oxidizing atmosphere contains an inert gas as a dilute gas.

As described above, the second oxidizing atmosphere has a lower oxygen concentration than the first oxidizing atmosphere. In other words, the second oxidizing atmosphere has a lower oxygen gas partial pressure than the first oxidizing atmosphere. Specifically, the rate of the inert gas is increased to reduce the oxygen gas concentration (oxygen gas partial pressure ratio). The oxygen gas concentration is preferably at most 2%. Such a low oxygen concentration leads to a low oxidation speed (oxidation rate). The oxidation speed is preferably at most 5 nm/hour, which is sufficiently lower than the normal oxidation speed, as described below. Such a low-speed oxidation treatment terminates a dangling bond at the interface between the gate oxide film 21 and the SiC region 17. This enables a sufficient reduction in interface state density.

Then, after the gas is exhausted from the reaction container, the temperature in the reaction container is reduced (step (d)). After the temperature in the reaction container lowers sufficiently, the substrate shown in FIG. 4 is taken out of the reaction container.

The above-described second thermal oxidation treatment will be described below.

FIG. 8 is a diagram showing the relationship between the oxidation rate (oxidation speed) and interface state density during the second thermal oxidation treatment. As seen in FIG. 8, at an oxidation speed of at most 5 nm/hour, the interface state density decreases rapidly. Thus, the oxidation speed during the second thermal oxidation treatment is preferably at most 5 nm/hour. When the gate oxide film is formed on a C plane in the SiC region, the oxidation speed during the second thermal oxidation treatment is preferably at most 5 nm/hour. However, when the gate oxide film is formed on an Si plane in the SiC region, the oxidation speed during the second thermal oxidation treatment is preferably at most 1 nm/hour. When the gate oxide film is formed on an (11-20) plane or a (1-100) plane in the SiC region, the oxidation speed during the second thermal oxidation treatment is preferably at most 3 nm/hour. In general, the oxidation rate for the C plane is about 5 to 10 times as high as that for the Si plane and about 3 to 5 times as high as that for the (11-20) plane or (1-100) plane. Thus, the oxidation speed during the second thermal oxidation treatment is set as described above.

FIG. 9 is a diagram showing the relationship between oxygen concentration (oxygen gas partial pressure ratio) and oxidation rate (oxidation speed) in the oxidizing atmosphere observed when the treatment temperature for the second thermal oxidation treatment is set to 1,000° C. and when the treatment temperature is set to 1,100° C. As seen in FIG. 9, when the oxidation temperature is 1,000° C., the oxidation rate can be easily controlled to at most 5 nm/hour. In contrast, when the oxidation temperature is 1,100° C., controlling the oxidation rate to at most 5 nm/hour is very difficult. Thus, the second thermal oxidation treatment is preferably performed at a temperature lower than 1,100° C. In particular, the second thermal oxidation treatment is preferably performed at a temperature lower than 1,000° C. Furthermore, too low an oxidation temperature makes production of the thermal oxidation treatment effect difficult. This prevents a sufficient reduction in interface state density. Thus, the second thermal oxidation treatment is preferably performed at a temperature higher than 800° C.

FIG. 10 is a diagram showing the relationship between the oxygen concentration (oxygen gas partial pressure ratio) and a flat band shift voltage observed during the second thermal oxidation treatment. The thermal oxidation temperature is 900° C. As seen in FIG. 10, when the oxygen concentration is at most about 2%, the flat band shift voltage decreases rapidly. Thus, the oxygen concentration (oxygen gas partial pressure ratio) during the second thermal oxidation treatment is preferably at most 2%.

FIG. 11 is a diagram showing the interface state densities obtained by the method according to the present embodiment and by a method in a comparative example (in which the low-speed oxidation is not performed). FIG. 11 indicates that the method according to the present embodiment enables a sufficient reduction in interface state density.

FIG. 12 is a diagram showing channel mobilities (field effect mobilities) obtained by the method according to the present embodiment and by the method in the comparative example. FIG. 12 indicates that the method according to the present embodiment offers a high channel mobility of about 100 $cm^2$/Vs.

As described above, in the present embodiment, the low-speed oxidation treatment at low oxygen concentration enables the dangling bond at the interface between the gate oxide film and the SiC region to be sufficiently terminated. Thus, the interface state density can be sufficiently reduced. As a result, in a MOS transistor having the gate oxide film formed by the method according to the present embodiment, a low flat band shift and a high channel mobility can be achieved. A MOS transistor offering excellent characteristics can thus be provided.

In the above-described embodiment, after the gate oxide film 21 of thickness about 50 nm is formed on the SiC region 17 by the first thermal oxidation treatment, the second thermal oxidation treatment (low-speed oxidation treatment) is performed. However, a first modification as described below is possible. In the first modification, first, a thin gate oxide film of thickness about 1 to 10 nm is formed on the SiC region by the first thermal oxidation treatment. Then, the second thermal oxidation treatment (low-speed oxidation treatment) is performed as is the case with the above-described embodiment. An additional insulating film (silicon oxide film or the like) of thickness about 49 to 40 nm is formed on the thin gate oxide film by a CVD (Chemical Vapor Deposition) method or a sputtering method. Thus, a gate insulating film with a thickness of about 50 nm is formed. This method enables a significant reduction in interface state density, thus providing a MOS transistor offering excellent characteristics, as is the case with the above-described embodiment.

Alternatively, a second modification as described below is possible. In the second modification, a preliminary gate oxide film (silicon oxide film or the like) is deposited on the SiC region 17 by the CVD method or sputtering method. A thermal oxidation treatment is subsequently performed on the preliminary gate oxide film under conditions similar to those for the first thermal oxidation treatment. Moreover, the second thermal oxidation treatment (low-speed oxidation treatment) is performed on the gate oxide film thus obtained. This method also enables a significant reduction in interface state density, thus providing a MOS transistor offering excellent characteristics, as is the case with the above-described embodiment.

In the above-described embodiment (including the first and second modifications), the pyrogenic oxidation technique is used for both the first and second thermal oxidation treatments. The first and second oxidizing atmospheres contain an oxygen gas ($O_2$ gas) and steam ($H_2O$). However, in the first and second thermal oxidation treatments, the atmospheres have only to contain at least the oxygen gas ($O_2$ gas) as an oxidizing gas. For example, the atmospheres may only contain the oxygen gas as an oxidizing gas. Even in this case, effects similar to those of the above-described embodiment can be exerted by performing the second thermal oxidation treatment at an oxidation speed of at most 5 nm/hour in the second oxidizing atmosphere having a lower oxygen concentration (oxygen partial pressure ratio) than the first oxidizing atmosphere as is the case with the above-described embodiment.

Furthermore, the methods shown in the above-described embodiment (including the first and second modifications) are applicable to a trench MOS transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the method comprising:
    forming a gate oxide film on an SiC region by a first thermal oxidation treatment in a first oxidizing atmosphere, wherein the gate oxide film is formed by oxidizing a surface of the SiC region by the first thermal oxidation treatment;
    performing a second thermal oxidation treatment at an oxidation speed of at most 5 nm/hour in a second oxidizing atmosphere having a lower oxygen concentration than the first oxidizing atmosphere, to increase film thickness of the gate oxide film, after the first thermal oxidation treatment; and
    forming a gate electrode on the gate oxide film with the increased film thickness,
    wherein the second thermal oxidation treatment is performed by an oxidation method that is the same as that of the first thermal oxidation treatment,
    the first thermal oxidation treatment is performed at a first temperature and the second thermal oxidation treatment is performed at a second temperature not higher than the first temperature, and
    the first temperature is lower than 1,000° C.

2. The method according to claim 1, wherein the second oxidizing atmosphere contains at least an oxygen gas.

3. The method according to claim 2, wherein the second oxidizing atmosphere further contains steam.

4. The method according to claim 3, wherein the second oxidizing atmosphere is obtained by pyrogenic oxidation.

5. The method according to claim 2, wherein the second oxidizing atmosphere has an oxygen as concentration of at most 2%.

6. The method according to claim 1, wherein the second thermal oxidation treatment is performed at a temperature lower than 1,000° C.

7. The method according to claim 6, wherein the second thermal oxidation treatment is performed at a temperature higher than 800° C.

8. The method according to claim 1, further comprising, before forming the gate oxide film, depositing a preliminary gate oxide film on the SiC region, wherein the preliminary gate oxide film is subjected to the first thermal oxidation treatment to form the gate oxide film.

9. The method according to claim 1, wherein the SiC region is formed on an SiC substrate of a first conductivity type.

10. The method according to claim 9, wherein the SiC region includes:
    a first region of the first conductivity type having a lower first conductivity type impurity concentration than the SiC substrate;
    a second region of a second conductivity type formed in a surface region of the first region;
    a source contact region of the first conductivity type formed in a surface region of the second region and having a higher first conductivity type impurity concentration than the first region; and
    a body contact region of the second conductivity type formed in the surface region of the second region and having a higher second conductivity type impurity concentration than the second region,
    wherein the second region has a portion sandwiched between the first region and the source contact region, and
    the gate electrode is formed at least above the sandwiched portion.

11. The method according to claim 10, further comprising:
    forming a source electrode contacting the source contact region and the body contact region; and
    forming a drain electrode contacting the SiC substrate.

12. The method according to claim 1, wherein the gate oxide film is formed on a C plane of the SiC region, and the second thermal oxidation treatment is performed at the oxidation speed of at most 5 nm/hour.

13. The method according to claim 1, wherein the gate oxide film is formed on an Si plane of the SiC region, and the second thermal oxidation treatment is performed at an oxidation speed of at most 1 nm/hour.

14. The method according to claim 1, wherein the gate oxide film is formed on a (11-20) plane or a (1-100) plane of the SiC region, and the second thermal oxidation treatment is performed at an oxidation speed of at most 3 nm/hour.

15. The method according to claim 1, wherein the oxidation method is pyrogenic oxidation.

\* \* \* \* \*